United States Patent [19]
Bhat et al.

[11] Patent Number: 5,381,434
[45] Date of Patent: Jan. 10, 1995

[54] HIGH-TEMPERATURE, UNCOOLED DIODE LASER

[75] Inventors: Rajaram Bhat, Red Bank; Chung-en Zah, Holmdel, both of N.J.

[73] Assignee: Bell Communications Research, Inc., Livingston, N.J.

[21] Appl. No.: 39,771

[22] Filed: Mar. 30, 1993

[51] Int. Cl.⁶ .............................................. H01S 3/19
[52] U.S. Cl. ..................................................... 372/45
[58] Field of Search ..................................... 372/45, 46

[56] References Cited

U.S. PATENT DOCUMENTS

| | | |
|---|---|---|
| 5,040,186 | 8/1991 | Logan et al. ........................... 372/45 |
| 5,251,225 | 10/1993 | Eglash et al. .......................... 372/45 |

OTHER PUBLICATIONS

C. E. Zah et al., "Low threshold 1.3 μm strained-layer $Al_xGa_yIn_{1-x-y}As$ quantum well lasers," *Electronics Letters*, Dec. 1992, vol. 28, pp. 2323–2324.

R. Bhat et al., "Low Threshold 1.3 and 1.55 μm Strained Quantum Well Lasers," Extended Abstracts of the 1992 International Conference on Solid State Devices and Materials, Tsukuba, 1992, pp. 604–606 (no month).

A. Kasukawa et al., "1.5 μm GaInAs/AlGaInAs Graded-Index Separate-Confinement-Heterostructure Quantum Well Laser Diodes Grown by Organometallic Chemical Vapor Deposition," *Japanese Journal of Applied Physics*, May 1992, vol. 31, pp. 1365–1371.

P. J. A. Thijs et al., "High Output Power (380 mW), Low Threshold Current (1.3 mA), Low Linewidth Enhancement Factor ($\leq 2$) $\lambda=1.3$ μm Strained Quantum Well Lasers," *Technical Digest*, 1991, 17th ECOC, vol. 2, pp. 48–51 (no month).

A. Kasukawa et al., "Very low threshold current density 1.5 μm GaInAs/AlGaInAs graded-index separate-confinement-heterostructure strained quantum well laser diodes grown by organometallic chemical vapor deposition," *Applied Physics Letters*, vol. 59, pp. 2486–2488, Nov. 1991.

R. Bhat et al., "OMCVD growth of strained $Al_xGa_yIn_{1-x-y}As$ for low threshold 1.3 μm and 1.55 μm quantum well lasers," 4th International Conference on *Indium Phosphide and Related Materials: Conference Proceedings*, Newport, R.I., Apr. 21–24, 1992, pp. 453–456.

*Primary Examiner*—James W. Davie
*Attorney, Agent, or Firm*—Leonard Charles Suchyta; Lionel N. White

[57] ABSTRACT

A semiconductor diode laser comprising an active layer (12) having multiple compressively strained quantum wells (54) of AlGaInAs sandwiched between barriers (52) of AlGaInAs lattice-matched to InP and of a precisely defined bandgap dependent on the composition of the quantum wells. The active layer is surrounded by oppositely doped cladding layers (48, 50, 52, 58, 60) so as to form an optical waveguide. The laser very efficiently emits 1.3-μm light, particularly at high operating temperatures.

15 Claims, 5 Drawing Sheets

$Al-Q = Al_xGa_yIn_{1-x-y}As$ $P-Q = Ga_xIn_{1-x}As_yP_{1-y}$

HIGH-TEMPERATURE, UNCOOLED DIODE LASER

FIELD OF THE INVENTION

The invention relates generally to semiconductor lasers. In particular, the invention relates to a compound-semiconductor, quantum-well diode lasers optimized for operation at a particular equivalent, for example, 1.3 micrometer.

BACKGROUND ART

The modern telephone and data network depends upon silica fibers for the transmission of data over optical fiber linking the transmitting and receiving ends. Silica fiber, while offering nearly unlimited bandwidth, has some limitations. Although its minimum absorption is centered in a band around 1.5 μm, an important characteristic of a fiber is its frequency-dependent dispersion. The dielectric constant, and thus the propagation speed of a signal on a fiber, varies with the frequency of the light propagating on the fiber. Dispersion is the rate of change of the dielectric constant with respect to wavelength (or frequency). Dispersion in a fiber causes optical signals at different optical frequencies to propagate at different speeds. As a result, short optical pulses, which in view of Fourier analysis contain many optical frequencies, spread in their temporal length as they propagate along a fiber exhibiting dispersion. Dispersional broadening limits the spacing between pulses and hence also limits the digital data rate that a fiber of a given length can support. Dispersional limitations in silica optical fibers can be largely overcome by conveying optical signals on the fiber in an optical frequency band around 1.3 μm because the dispersion passes through zero at 1.31 μm. Hence, the existing fiber networks for local exchange access are optimized for the 1.3 μm band.

The light source is probably the most challenging component requiring development for a fiber communication system. Bellcore has issued Technical Advisory TA-TSY-000983, Issue 1, 1990 entitled "Reliability Assurance Practices for Optoelectronic Devices in Loop Applications," which defines requirements for the laser diode or other equivalent light emitting elements. Aggressive target specifications for the light emitting element are listed in TABLE 1. These requirements are so strict that only a semiconductor laser could realistically satisfy them. In addition, since the application is for a light source in the local telephone loop, the device should be uncooled, that is, no thermoelectric coolers is needed, so that the cost is kept low.

TABLE 1

| Parameter | Minimum | Maximum | Unit |
|---|---|---|---|
| Operating Temperature | −45 | 85 | °C. |
| $I_{Th}$ @ 25° C. | 1 | 20 | mA |
| $I_{Th}$ | 3.5 | 50 | mA |
| $P_{Op}$ @ $I_{Mod}$ = 25 mA | 4.0 | | mW |
| $P_{Op}$ @ $I_{Th}$ | | 50 | μW |
| Δη 25 to 85° C. and 25 to −45° C. | | ±1 | dB |
| Mean Wavelength | 1270 | 1340 | nm |
| FWHM | | 5 | nm |
| RMS | | 2.5 | nm |
| $V_f$ @ $I_{Mod}$ = 25 mA | | 1.5 | V |
| Kink Current | 60 | | mA |

Except as specified, these requirements apply to the entire stated temperature range.

Some of these requirements are particularly difficult to satisfy, particularly at the higher temperatures. These difficult requirements include: threshold current $I_{Th}$ at which the diode begins to lase; differential quantum efficiency η and its change Δη; and the optical output power $P_{Op}$ at the operating current $I_{Mod}$. The operational temperature range extends to 85° C. so that expensive and unreliable thermoelectric coolers are not required.

SUMMARY OF THE INVENTION

Accordingly, an object of the invention is to provide a semiconductor laser having low threshold current, high output power, and nearly constant differential quantum efficiency and operating over a wide temperature range.

A special object of the invention is to provide such a laser for the 1.3-μm band.

The invention may be summarized as a laser diode based on the AlGaInAs/InP materials family. The active layer includes one or more compressively strained quantum-well active layers of GaInAs, preferably AlGaInAs, or InGaAsP. The quantum wells are sandwiched between barrier layers of AlGaInAs having a bandgap carefully selected with respect to the quantum-well layer.

DETAILED DESCRIPTION OF THE PREFERRED EMBODIMENTS

Figure 1:
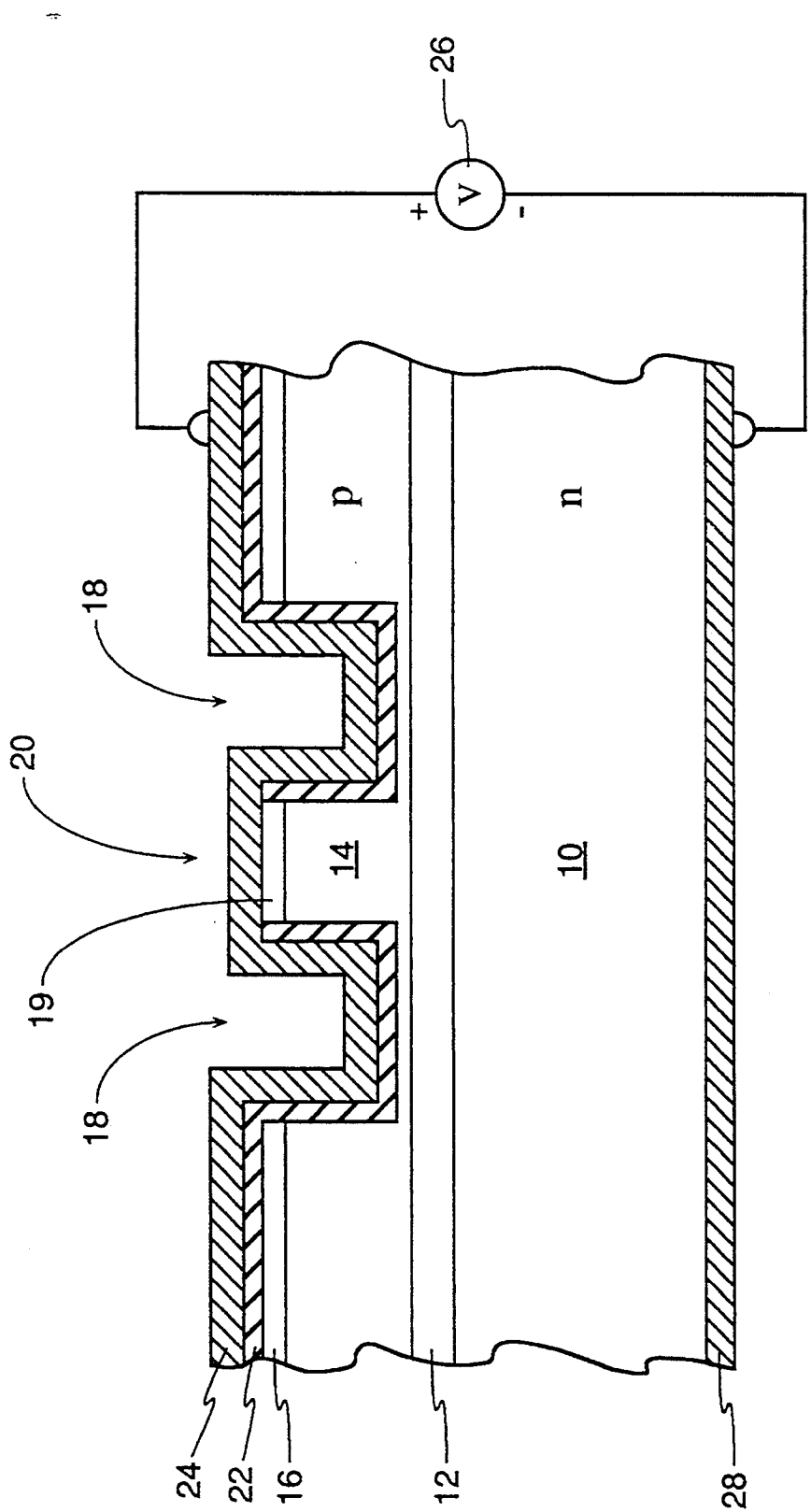
FIG. 1 is a cross-sectional view of a ridge waveguide laser in which the invention can be used.

The invention is a solid-state, compound-semiconductor optical element of the AlGaInAs/InP materials group that is lean in Al. The active layer includes one or more quantum wells, preferably compressively strained, of GaInAs (or preferably AlGaInAs or alternatively InGaAsP), sandwiched between barriers of AlGaInAs that are either lattice matched to InP or tensilely strained to compensate for the compressively strained active layers. The bandgap, and hence the composition, of the AlGaInAs barriers is carefully chosen so as to optimize the optical performance of the optical layer.

AlGaInAs/InP lasers have not been studied as extensively as GaInAsP/InP because of the common belief that Al oxidation causes long-term degradation, as was observed for GaAs/AlGaAs or InGaAs/AlGaAs lasers grown on GaAs substrates. However, a AlGaInAs/InP laser has inherent advantages over a GaInAsP/InP laser because of the large conduction band offset, $0.7\Delta E_g$ vs. $0.4\Delta E_g$, across the heterojunction of the laser. The large offset allows electron confinement at high temperature in the quantum wells of InGaAs or even AlGaInAs of low aluminum content.

The preferred embodiment utilizes and thereby incorporates some of the work of the inventors' experimental group and other collaborators in the field of strained quantum-well lasers based on the AlGaInAs/InP family of materials. This work has been described by Bhat et al. in "Low Threshold 1.3 and 1.55 μm Strained Quantum Well Lasers, *Extended Abstracts of the 1992 International Conference on Solid State Devices and Materials*, Tsukuba, 1992, pp. 604–606 and by Zah et al. in "Low threshold 1.3 μm strained-layer Al$_x$Ga$_y$In$_{1-x-y}$As quantum well laser," *Electronics Letters*, 1992, pp. 2323–2324. Additional portions of the technology have been described by: (1) Kasukawa et al. in "1.5 μm GaInAs/AlGaInAs graded-index separate-confinement-heterostructure quantum well laser diodes grown by organometallic chemical vapor deposition," *Japanese Journal of Applied Physics*, vol. 31, 1992, pp. 1365–1371; (2) Thijs et al. in "High output power (380 mW), low threshold current (1.3 mA), low linewidth enhancement factor ($\leq$2))γ=1.3 μm strained quantum well lasers," *ECOC*, 1991; (3) Kasukawa et al. in "Very low threshold current density 1.5 μm GaInAs/AlGaInAs graded-index separate-confinement-heterostructure strained quantum well laser diode grown by organometallic chemical vapor deposition," *Applied Physics Letters*, vol. 59, 1991. pp. 2486–2488; and (6) Bhat et al. in "OMCVD growth of strained Al$_x$Ga$_y$In$_{1-x-y}$ for low threshold 1.3 μm and 1.55 μm quantum well lasers," *4th International Conference on Indium Phosphide and Related Materials: Conference Proceedings*, Apr. 21–24, 1992, pp. 453–456.

There are at least two laser structures usable with the detailed embodiment of the invention described below. The general features of both structures and how to form them are described in the first two cited references of the inventors.

A first structure, illustrated in cross section in FIG. 1, is a ridge-waveguide laser. On an n-type InP substrate 10 is grown an AlGaInAs active layer 12, the details of which are important to the invention. A p-type InP layer 14 is deposited on the active layer 12. The n-type substrate 10 acts as a lower cladding, and the p-type layer 14 acts as an upper cladding so together they waveguide light in and adjacent to the active layer 12. A heavily doped, contact p++-type InGaAs layer 16 is deposited over the upper cladding layer 14. Then, a lithographic step forms two trenches 18 through the contact layer 16 and most of the upper cladding layer 14 with a ridge 20 between them, leaving an isolated contact 19 remaining from the contact layer 16 at the top of the ridge 20. After the top of the ridge 20 is masked, an insulating oxide layer 22 of SiO$_2$ is deposited over other areas. Finally, a Ti/Au metallization 24 is deposited, which effectively electrically contacts only the contact 19 at the top of the ridge 20. A biasing source 26 attached across the Ti/Au metallization 24 and a metallization 28 on the substrate 10 passes current vertically through the ridge 20 to the substrate 10 across the p-n diode formed between the upper and lower claddings 14 and 10 with the active layer 12 between them. The illustrated polarity forward biases the p-i-n structure. Thereby, the active layer 12 generates light that is horizontally guided between the upper and lower claddings 14 and 10. The light is reflected and thus fed back from partial reflectors on the axial ends of the ridge 20 and is output from one of them. The structure lases above the threshold current $I_{Th}$.

Figure 2:
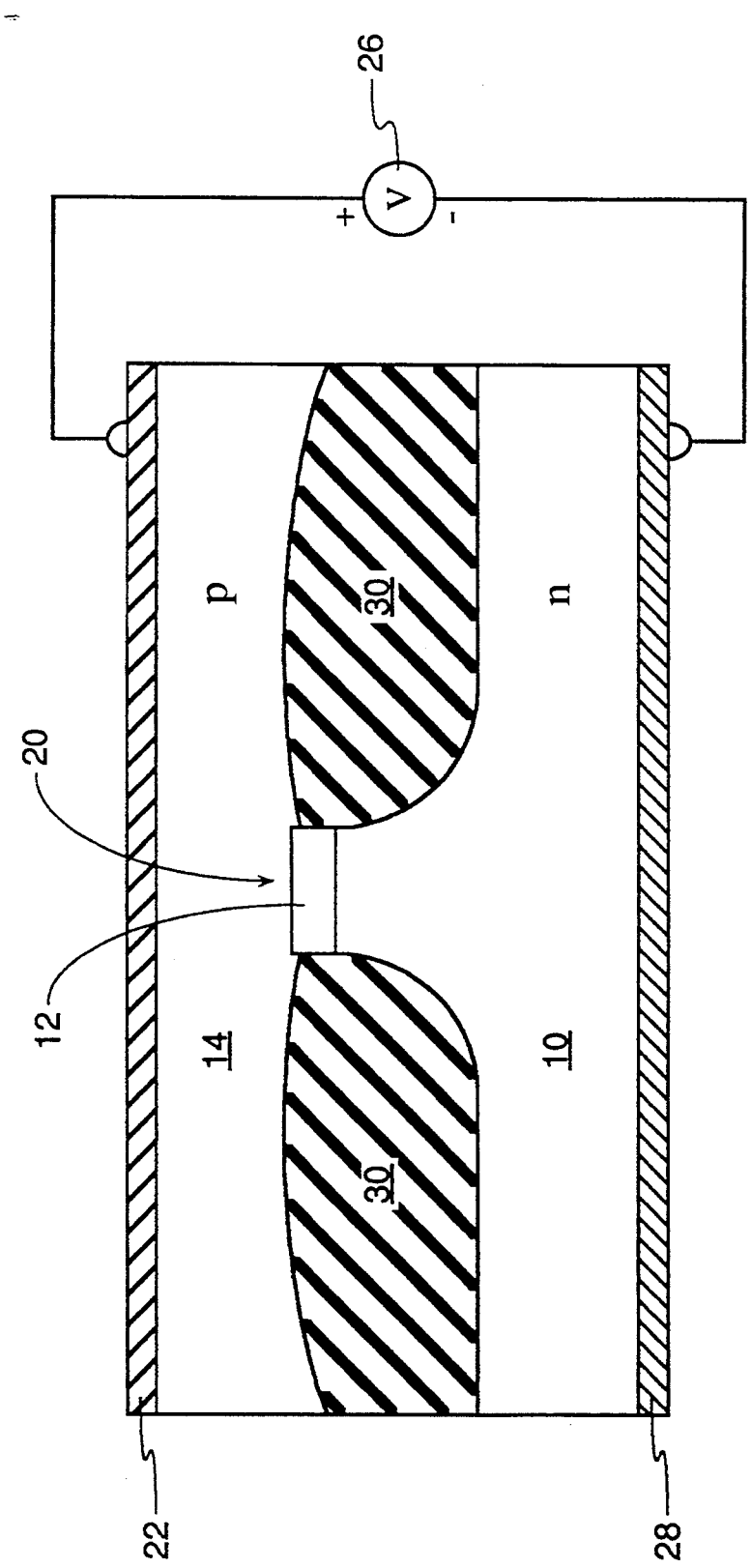
FIG. 2 is a cross-sectional view of a semi-insulating, planar, buried-heterostructure laser in which the invention can also be used.

A second structure, illustrated in cross section in FIG. 2, is a semiconductor, buried-heterostructure laser. The AlGaInAs active layer 12 is grown over the n-type InP substrate 10. The ridge 20 is masked, and the surrounding material is etched well into the InP substrate 10. A semi-insulating InP layer 30 is then regrown around and almost to the top of the ridge 20. The p-type, upper cladding layer 14 is grown on top of the active layer 12 and the semi-insulating layer 30. An unillustrated n-type layer separates the semi-insulating layer 30 from the p-type upper cladding layer 14. The p++-type contact layer 22 and associated metallization are deposited on the upper cladding layer 14. The semi-insulating layer 30 confines the biasing current through the active layer 12 in the ridge 20. Both these structures, aside from the details of the active layer 12 and associated transition structure, are well known.

Figure 3:
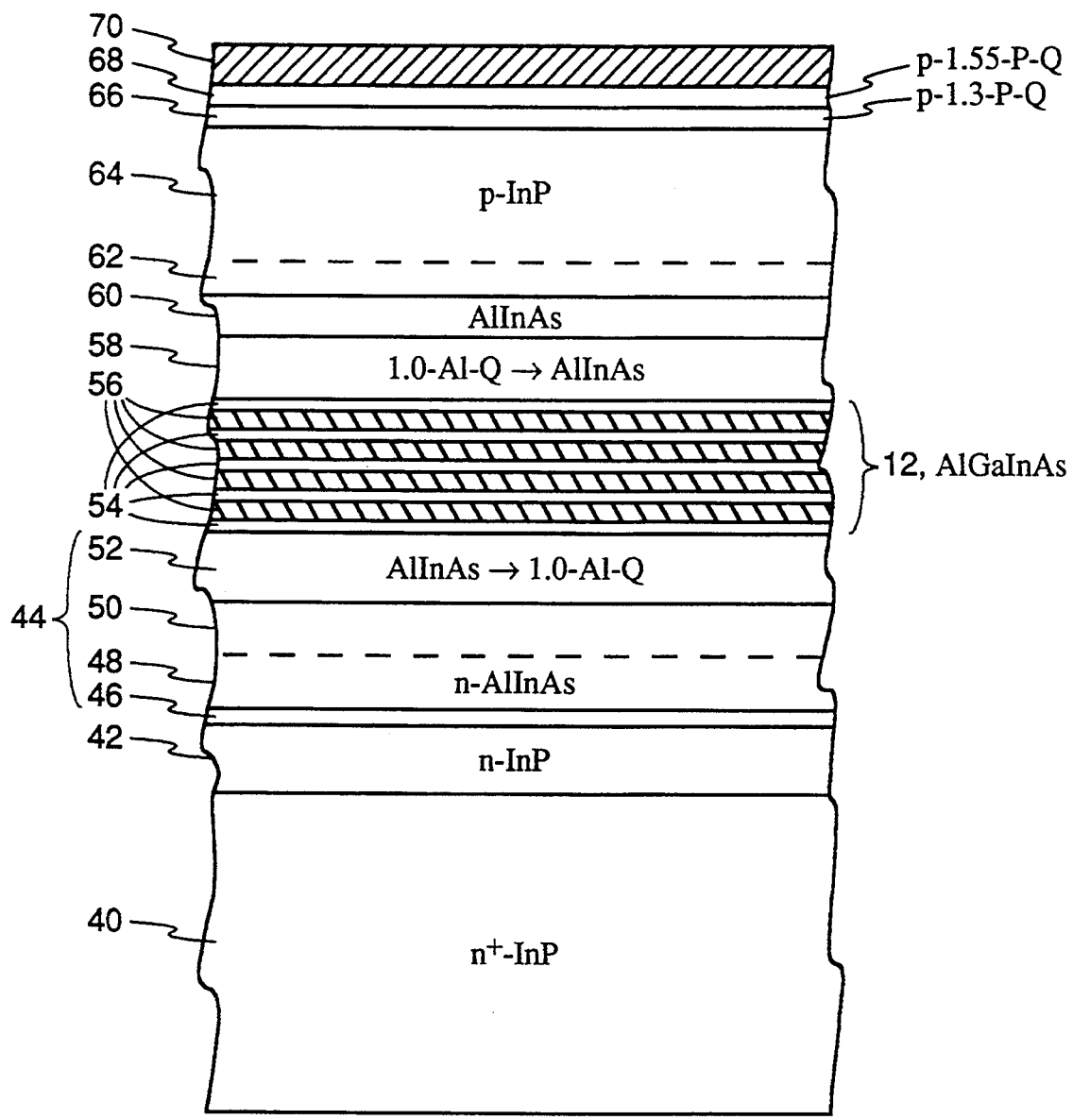
FIG. 3 is a cross-sectional view of the region near the active layer in an embodiment of the invention.

A working embodiment of the invention is illustrated in the cross section of FIG. 3. It includes an active layer 12 having carefully defined quantum wells of biaxially compressively strained AlGaInAs separated by equally carefully defined barriers of unstrained or tensilely strained AlGaInAs. The structure is epitaxially grown by organometallic chemical vapor deposition (OMCVD)) on a heavily doped n+-type InP substrate 40 following the general procedures described in the above cited articles by the inventors' experimental group.

A lower cladding layer 42 of InP doped n-type to $1 \times 10^{18}$ cm$^{-3}$ is grown to a thickness of 1 μm over the substrate 40. Hydrogen sulfide is used for all n-type doping and dimethyl zinc for all p-type doping in the grown layers. Layers stated to be undoped may contain trace amounts of electrically active dopants, due to out diffusion of Zn. A lower transition region 44 consists of four parts and improves on the basic structures of FIGS. 1 and 2. An initial, compositionally graded layer 46 doped n-type to $1 \times 10^{18}$ cm$^{-3}$ is graded to In$_{0.48}$Al$_{0.52}$As over 10 nm starting with 1.0-Al-Q (this notation will be explained later). This composition of InAlAs is lattice matched with InP. Two layers 48 and 50 of n-type In$_{0.48}$Al$_{0.52}$As are then grown. The lower one 48 has a thickness of 40 nm and is doped n-type to $1 \times 10^{18}$ cm$^{-3}$ while the upper one 50 has a thickness of 50 nm and is doped slightly lower to $7 \times 10^{17}$ cm$^{-3}$. Both InAlAs layers 48 and 50 act to confine electrons in the active layer 12.

Figure 4:
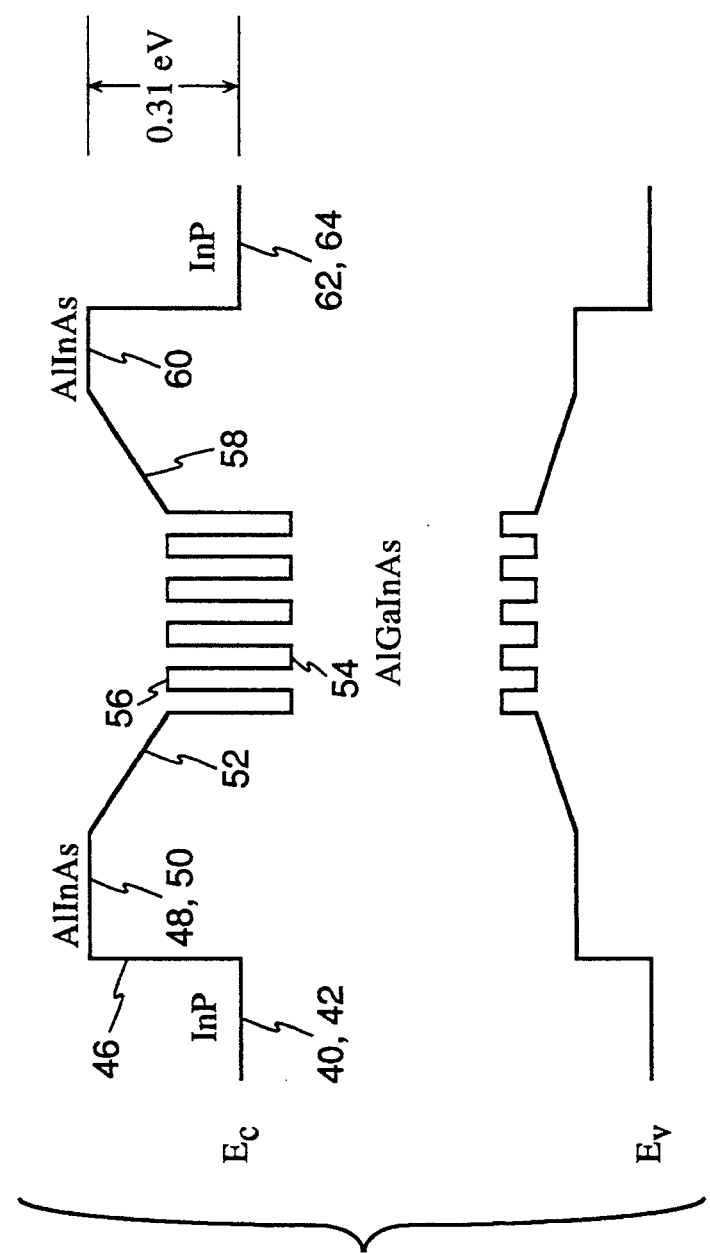
FIG. 4 is a schematic of the energy band structure in and around the active layer of the device of FIG. 3.

The electronic band structure for most of this structure is illustrated in FIG. 4. The InP/AlInAs graded layer 46 and the more heavily doped lower AlInAs layer 48 assist electrons near the conduct/on band in overcoming the 0.31 eV barrier between InP and AlInAs.

An undoped confinement-to-barrier transition layer 52 deposited over the upper AlInAs layer 50 is linearly graded in composition between the In$_{0.48}$Al$_{0.52}$As composition of the layers 48 and 50 and the composition of the quantum-well barriers to be described in detail later. The confinement-to-barrier transitional layer 52 has a thickness of 100 nm.

The active layer 12 consists of five quantum wells 54 sandwiching four barrier layers 56. The neighboring transitional layers act as barriers on the exterior of the so defined active layer 12.

The five quantum wells 54 are undoped and have a composition of Al$_{0.18}$Ga$_{0.12}$In$_{0.70}$As and a thickness of 8.8 nm. Quantum wells are so thin that bound energy states for electrons and holes form within the wells resulting in a two-dimensional density of states. Wells of this thickness and composition produced were photoluminescently measured as producing a bandgap of 1.29 μm. The stated composition also means that the quantum wells 54 are compressively strained because the rest of the structure is either InP or a material lattice-matched to it. The quantum wells 54 are insufficiently thick for the strain to produce dislocations or other strain relieving defects. That is, the quantum wells 54 are of pseudomorphic thickness. The amount of compressive (or tensile) strain may be calculated by comparing a compositionally related linear combination of the lattice constants of AlAs, GaAs, and InAs with InP.

Figure 5:
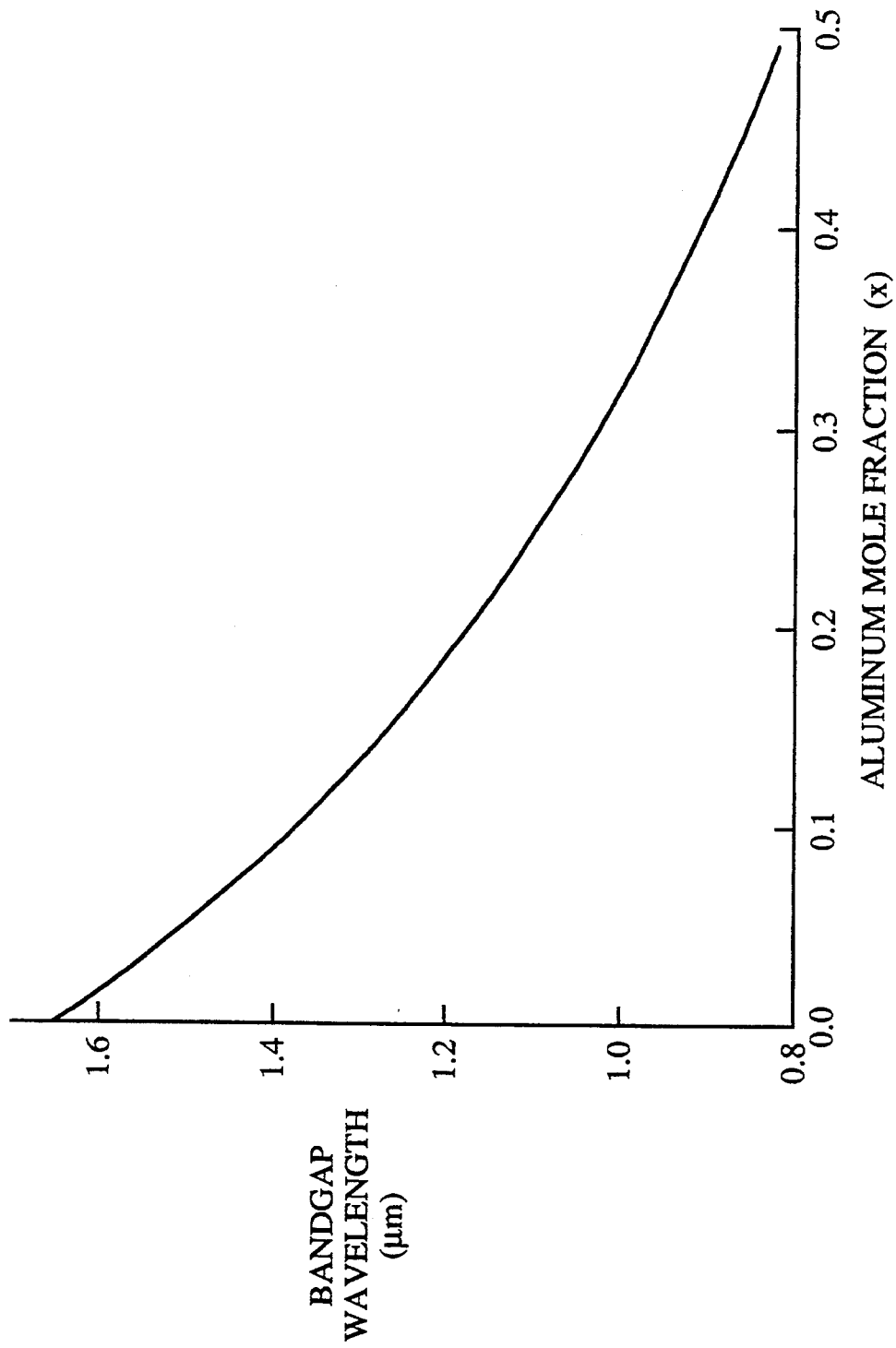
FIG. 5 is a graph of the bandgap of AlGaInAs lattice-matched to InP as a function of the aluminum content.

The four barriers 56 have a composition which will be denoted as 1.0-Al-Q. The barriers are undoped, and each has a thicknesses of 10 nm. The Al-Q notation designates a quaternary composition $Al_xGa_yIn_{1-x-y}As$ that is lattice matched to InP. The numerical designation refers to the electronic bandgap in terms of the bandgap wavelength of the material expressed in micrometers. The lattice-matching condition is expressed as $$y = 0.468 - 0.983x,$$

and the bandgap energy is expressed in eV by $$E_g = 0.36 + 2.093x + 0.629y + 0.577x^2 + 0.456y^2,$$

which is related to the bandgap wavelength by $\lambda(\mu m) = 1.24/E_g(eV)$. If the bandgap is known, then combining the above two equations produces a quadratic equation in x or y. The complete relationship is illustrated in the graph of FIG. 5. Thus, 1.0-Al-Q has a composition of x=0.318 and y=0.154. These values are based on the above energy dependence, the accuracy of which is not known. In practice, the bandgap wavelength is experimentally measured by photo-luminescence.

Over the active layer 12 is grown an undoped barrier-to-confinement transitional layer 58, which is symmetric with the lower confinement-to-barrier transitional layer 52 and over which is grown an undoped upper confinement layer 60 of $In_{0.48}Al_{0.52}As$ having a thickness of 50 nm. A pair of p-type upper cladding layers 62 and 64 are then grown. The lower one 62 has a thickness of 0.2 μm and is doped $7 \times 10^{17}$ cm$^{-3}$ while the upper one has a thickness of 1.8 μm and is doped to $1 \times 10^{18}$ cm$^{-3}$. This differential doping minimizes absorption loss and reduces the series resistance without causing the p/n junction to move into the active layer because of Zn diffusion.

Over the cladding layer 66 are grown a 1.3-P-Q layer 66 doped p-type to $1 \times 10^{18}$ cm$^{-3}$ and a 1.55-P-Q layer 68 doped p-type to $1 \times 10^{18}$ cm$^{-3}$. The designation P-Q refers to the quaternary composition $Ga_xIn_{1-x}As_yP_{1-y}$ that is lattice matched to InP. Again, the numerical designation is the bandgap wavelength. The P-Q layers serve as the step-graded layers between the p-InP and p$^{++}$-InGaAs to reduce the series resistance by reducing the effect of the valence-band offset. The vertical growth of the structure is completed with a contact layer 70 of $In_{0.47}Ga_{0.53}As$ doped p$^{++}$-type to greater than $2 \times 10^{19}$ cm$^{-3}$ and having a thickness of 0.3 μm. Metallizations are applied to both the n$^{++}$ substrate 40 and the p$^{++}$ contact layer 70 so as to form a p-n junction across the active layer 12.

Such a structure was grown, and the structure was laterally defined into a ridge waveguide of the type illustrated in FIG. 1 so as to laterally confine carriers and photons. Such laterally defined chips were cleaved such that diode lasers were fabricated with a number of cavity lengths. The diode lasers were then electrically and optically characterized. These results are summarized in TABLE 2 for different cavity lengths of the preferred embodiment with the facet ends left uncoated. Preferably, one facet end would be made very reflective, anti the other made optimally reflective for optical output.

TABLE 2

| Cavity Length (μm) | 300 | 600 | 900 | 1200 | 1500 |
|---|---|---|---|---|---|
| $I_{Th}$(mA) @ 25° C. | 13.2 | 18.9 | 23.5 | 29.6 | 35.4 |
| $I_{Th}$(mA) @ 65° C. | 23.1 | 29.9 | 37.9 | 46.6 | 55.5 |
| $I_{Th}$(mA) @ 85° C. | 32.2 | 38.9 | 49.1 | 60.2 | 70.5 |
| $P_{Op}$(mW) @ $I_{Th}$ + 25 mA, 25° C. | 6.01 | 5.42 | 4.6 | 4.37 | 3.95 |
| $P_{Op}$(mW) @ $I_{Th}$ + 25 mA, 65° C. | 5.06 | 4.56 | 3.87 | 3.58 | 3.12 |
| $P_{Op}$(mW) @ $I_{Th}$ + 25 mA, 85° C. | 3.99 | 3.86 | 3.34 | 3.12 | 2.75 |
| Slope (mW/mA) | 0.24 | 0.22 | 0.18 | 0.17 | 0.16 |
| External η | 0.46 | 0.41 | 0.35 | 0.33 | 0.30 |
| Δη, 25–65° C. (dB) | −0.73 | −0.67 | −0.45 | −0.79 | −1.17 |
| Δη, 25–85° C. (dB) | −1.56 | −1.25 | −1.03 | −1.30 | −1.46 |
| Wavelength (nm) @ 25° C. | 1347 | | 1363 | | 1367 |
| FWHM | 1.00 | | 0.70 | | 0.30 |

As is apparent from TABLE 2, the invention nearly meets the requirements of TABLE 1. In spite of the high mole fraction of aluminum in the waveguide and active regions, the initial life tests indicate no catastrophic facet damage or short term degradation. These life tests are contrary to the conventional wisdom described above that aluminum oxidation causes long-term degradation.

Three sets of comparative examples were grown that were similar to the above embodiment. However, they differed in that the composition of the quantum-well barriers was changed from 1.0-Al-Q to either 0.95-Al-Q, 1.1-Al-Q, or 1.2-Al-Q. In the cases of the 0.95-Al-Q and 1.2-Al-Q, the resultant lasers show distinctly inferior characteristics. In particular, at 85° C. and for the shortest cavity length, they showed twice the threshold current and half the optical output at the normal operating current. The lasers having a barrier composition of 1.1-Al-Q are considered to be marginal but adequate.

The invention is not limited to the specific structure and compositions given in the first detailed embodiment.

The barrier thicknesses can preferably extend through a range from 6 to 20 nm, and the confinement layer thicknesses can vary from 50 to 200 nm each. The n-type InP cladding layer, if used, can likewise range from 0.5 to 5 μm, and the p-type cladding layer from 1 to 5 μm.

The precise value of compressive strain is non-critical. The aluminum content of the quantum wells may be varied and may be zero.

The detailed example involved a 1.3-μm laser, but the invention could be used for other emission wavelengths with the type of compositional optimization described in detail above for 1.3 μm.

The most important, although not only, application of the invention is its use as a laser or other continuously light-emitting device. A related use of the invention is as a semiconductor amplifier having high gain and efficiency. Of course, a laser is an amplifier with substantial optical feedback.

The barrier layers, rather than being unstrained with respect to InP, may be tensilely strained to thereby partially or completely relieve the compressive strain of the quantum-well layers. Thereby, a large number of compressively strained quantum-well layers can be included without exceeding the total pseudomorphic thickness.

In another embodiment of the invention, the quantum wells are composed of compressively strained InGaAsP. The combination of InGaAsP quantum wells and AlGaInAs barriers can be optimized to provide superior diode lasers in view of the bandgap offset between these two materials.

The invention thus provides a highly efficient laser operable at higher temperatures, and its usefulness has been proved for the 1.3-μm emission band.

What is claimed is:

1. A semiconductor optical device comprising:
   upper and lower cladding layers comprising respective III-V semiconductors of opposite doping types; and
   an active layer between said cladding layers comprising at least one compressively strained quantum-well layer comprising AlGaInAs surrounded by barrier layers of AlGaInAs.

2. A semiconductor optical device as recited in claim 1, wherein said quantum-well layer comprises AlGaInAs having Al in an atomic amount that is less than a sum of the atomic amounts of Ga and In.

3. A semiconductor optical device as recite in claim 2, wherein said quantum-well layers comprise $Al_{0.18}Ga_{0.12}In_{0.70}As$.

4. A semiconductor optical device as recited in claim 1, wherein said barrier layers have an electronic bandgap wavelength of between 0.95 and 1.2 μm and said optical device emits at a wavelength around 1.3 μm.

5. A semiconductor optical device as recited in claim 4, wherein said electronic bandgap wavelength approximately equals 1.0 μm.

6. A semiconductor optical device as recited in claim 4, wherein said barrier layers have a composition substantially lattice-matched to InP.

7. A semiconductor optical device as recited in claim 4, wherein said barrier layers have a composition tensilely strained in partial compensation of the compressive strain of a plurality of said quantum-well layers.

8. A semiconductor optical device as recited in claim 1, additionally comprising a bias source for forward biasing said cladding layers.

9. A semiconductor optical device as recited in claim 1, wherein said cladding layers comprise AlInAs lattice-matched to InP and further comprising confinement layers respectively disposed between said cladding layers and said active layer, compositionally graded between said cladding layers and a composition of said barrier layers, and lattice-matched to InP.

10. A semiconductor optical device comprising;
    upper and lower cladding layers comprising III-V semiconductor compositions of opposite conductivity type; and
    an active layer disposed between said upper and lower cladding layers and comprising at least one compressively strained quantum well comprising a GaInAs compound and barrier layers comprising AlGaInAs sandwiching said quantum well.

11. A semiconductor optical device as recited in claim 10 wherein said GaInAs compound is InGaAsP.

12. A diode laser comprising:
    an upper and a lower cladding layer comprising III-V semiconductor compositions and having portions of opposite conductivity type; and
    an active layer of a plurality of quantum-well layers separated by barrier layers, each said quantum-well layer comprising compressively strained AlGaInAs and each said barrier layer comprising AlGaInAs.

13. A diode laser as recited in claim 12, wherein each said barrier layer comprises unstrained AlGaInAs.

14. A diode laser as recited in claim 12, wherein each said barrier layer comprises tensilely strained AlGaInAs compensating for compressive strain in said quantum-well layers.

15. A diode laser as recited in claim 12, wherein each said barrier layer comprises AlGaInAs having a bandgap wavelength between 0.95 and 1.2 μm.

* * * * *